United States Patent [19]
Spinner

[11] Patent Number: 5,869,961
[45] Date of Patent: Feb. 9, 1999

[54] SMART IC-TEST RECEPTACLE HAVING HOLES ADAPTED FOR MOUNTING CAPACITORS ARRANGED ADJACENT TO PIN POSITIONS

[76] Inventor: Howard D. Spinner, 16456 Hilow Rd., Los Gatos, Calif. 95032

[21] Appl. No.: 509,389

[22] Filed: Jul. 31, 1995

[51] Int. Cl.⁶ .................................................. H01R 13/648
[52] U.S. Cl. ........................................ 324/158.1; 439/608
[58] Field of Search ...................... 324/754–765; 439/108, 525, 608, 620

[56] References Cited

U.S. PATENT DOCUMENTS

| | | | |
|---|---|---|---|
| 4,222,626 | 9/1980 | Hollyday et al. | 439/525 |
| 4,627,678 | 12/1986 | Biswas | 439/75 |
| 4,660,907 | 4/1987 | Belter | 439/108 |
| 5,057,041 | 10/1991 | Yu et al. | 439/620 |
| 5,184,285 | 2/1993 | Murphy et al. | 361/813 |
| 5,399,104 | 3/1995 | Middlehurst et al. | 439/608 |
| 5,439,384 | 8/1995 | Thrush et al. | 439/69 |
| 5,519,331 | 5/1996 | Cowart et al. | 324/755 |

Primary Examiner—Vinh P. Nguyen
Assistant Examiner—Russell M. Kobert
Attorney, Agent, or Firm—Donald R. Boys

[57] ABSTRACT

A method for customizing a printed circuit board comprises steps of registering a template to the PCB, the template having an opening in registration defining a volume on the PCB where a conductive trace or jumper is desired, placing a semi-liquid conductive polymer in the opening, removing the template, leaving a conductive polymer trace or jumper on the PCB, and curing the conductive polymer. The method is applied to load boards for IC test apparatus and to unique receptacles for coupling test sockets to load boards. Receptacles according to the invention have decoupling capacitors mounted through the receptacle, providing capacitor connection very near leads for devices under test in such apparatus. In an embodiment of the unique receptacle, a power plane is provided as well as a ground plane, allowing the receptacle to provide complete customization for more generic load boards. In another embodiment, power and ground sensing lines are brought to the unique receptacle as well.

4 Claims, 13 Drawing Sheets

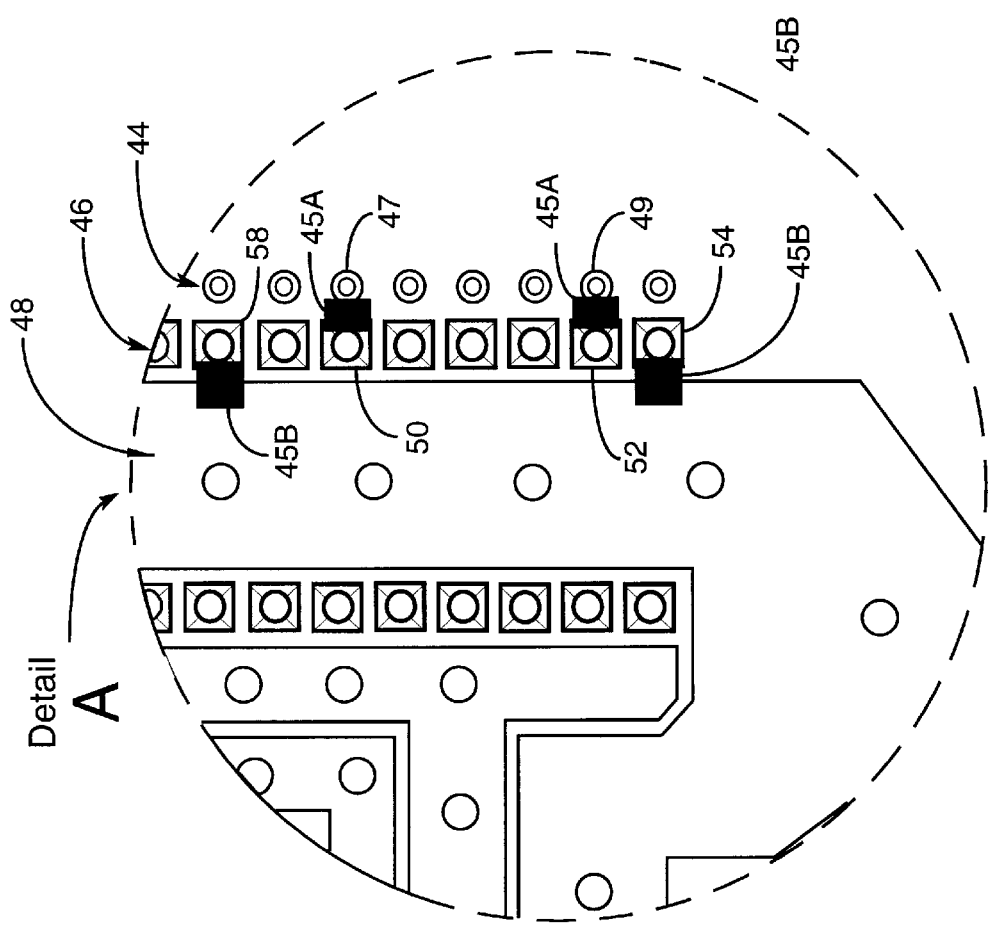

SMART IC-TEST RECEPTACLE HAVING HOLES ADAPTED FOR MOUNTING CAPACITORS ARRANGED ADJACENT TO PIN POSITIONS

FIELD OF THE INVENTION

The present invention is in the area of methods and apparatus for testing integrated circuits (ICs), and pertains more particularly to customizing power and ground connections on printed circuit boards (PCBs) called load boards in the art, wherein the load board provide conductive paths for signals, power, and ground to sockets for testing ICs.

BACKGROUND OF THE INVENTION

At the time of the present invention, integrated circuits (ICs) in a wide variety of sizes and for a wide variety of purposes have been developed and commercialized. ICs are typically rectangularly shaped dies, also called chips, of semiconducting silicon upon which solid state transistors and interconnecting circuitry have been constructed, and connection to off-chip circuitry is provided through contact leads and bonding pads arranged around a periphery of such a chip.

To protect an IC die and to provide a standard physical interface to, for example, a printed circuit board, such die are typically encapsulated in plastic or ceramic material with wires bonded to bonding pads on a die and to conductive leads leading away from the die. The conductive leads are ultimately soldered to electrical traces on a printed circuit board for use in any one of many electronic applications.

It has been a trend in the art to accomplish increased device density and smaller circuitry dimensions in ICs, to provide more circuitry in a smaller space. There is a trend as well to accomplish increased speed at which an IC operates. As ICs become more complex and powerful as a result, thorough testing of many thousands (sometimes millions) of transistors and miles of interconnective traces has become ever more critical. Typically, an effort is made to test every transistor and every connection of an IC to assure proper operation.

The present invention is in the area of test apparatus for testing ICs. In following descriptions and discussions, ICs to be tested and under test will be referred to generally as device-under-test (DUT), as is common in the art.

Partly because of a trend to smaller die and to more contacts to the outside world from an IC, reliably connecting bonding pads on a die to perform thorough testing is not a simple exercise. Because of this, most ICs are tested after packaging, although in some cases ICs are tested before packaging, and even before individual ICs are separated from semiconductor wafers upon which they are constructed. Methods are also being developed to mount ICs on circuit boards without packaging.

The IC testing process is historically one of placing a packaged IC in a test socket, with leads of the IC making electrical contact with contact pads or lands in a socket. In present art, a computerized tester, to be more fully described below, comprising a CPU, power supply, suitable memory, and control routines developed for testing an IC, provides test vectors, power, and ground connections through an interface harness to a test head. In a test head, power, ground, and vector signal lines are interfaced through a somewhat complex distribution system, which includes pin electronics boards, and provided finally to leads of a DUT placed in a test socket connected to a load board.

Typically, each individual DUT has a dedicated set of software control routines to be executed on a tester to provide a serial stream of test vectors for a DUT. There will also typically be an especially designed and constructed load board for a unique type of DUT, and a specific socket interfaced to a load board, and a particular power and ground connection to suit the unique configuration of the DUT.

In design and development of an IC, information is also used to develop software for testing ICs manufactured according to a particular design. A customized load board and a customized socket is also typically developed. One may have, for example, a batch of 100 packaged ICs of a particular design to be tested. To prepare to test these devices, a customized load board is assembled to a test head. A test socket, with connections configured to meet appropriate leads on a DUT, is assembled to the board, and customized software for that DUT is loaded into a test system.

After a test apparatus is customized to a DUT and a dedicated software is loaded, the 100 DUT's are installed and removed serially, with a test vector set applied to each in order. Typically, if a DUT fails, a test system reports the failure. After the 100 devices are tested, much of a test system (tester, software, load board, socket) is reconfigured for a new batch of DUT types to be tested. Test systems are sometimes manual, and sometimes complex material handling systems may be interfaced to a test system for presenting DUTs to a tester.

The shape and size of IC packages varies, the number of leads varies from type to type, the size and geometry of leads varies, the position of leads where the power supply voltages and grounds must be applied differs from type to type, and so on. Different standard packages are given names, such as dual in-line package (DIP) and quad flat package (QFP). In current art, load boards are designed and manufactured to fit a unique configuration of each DUT.

In many cases, although a single load board may be able to serve a variety of different DUTs having a common package configuration and lead geometry and configuration, power connections and ground lead locations will vary. Load boards, in these cases, have to be configured somehow so power supply and ground connections match with connective requirements of a unique DUT.

In some instances, user's prefer a completely customized board, so power and ground connections terminate at points aligning with socket connections. This is a relatively expensive solution, requiring an entirely different, fully customized board for each DUT, even if several devices to be tested have a common size and lead configuration and can be interfaced to a common socket.

An alternative solution is to bring signal leads to all lead positions at an interface area on a load board, and to provide power and ground points or pads nearby each lead position. Then power and ground may be jumpered to appropriate points at the interface according to the unique requirements for each DUT. In this manner, a common load board may be provided for a large number of DUTs, and customization is done on the common board by one or another finishing technique.

One method of finishing and customizing a load board of the type described above, involves hand-soldering a solder bridge or a jumper wire from power and ground locations nearby, to pads contiguous with through-holes to which socket or receptacle pins may be mounted. That is, given a pattern, for example, of through-holes on a load board to which pins of a receptacle or a socket will be engaged, the through-holes typically corresponding to the leads of a DUT, one simply provides a jumper one-at-a-time to each through-hole for a pin requiring power or ground.

There are some problems inherent in soldering on such a load board, however. Plated through-holes and solder pads on a load board are typically very small and necessarily closely-spaced. This makes such a soldering process, either with or without jumper wires, time-consuming, costly, and somewhat risky. Such solder connections must be very carefully made on a board that may represent a several thousand dollar investment, without damaging plated through holes, contact pads, or surface of the load board. An improper connection or damaged test surface may mean a scrapped board and costly delays.

A new apparatus and method for customizing load boards quickly, inexpensively, and without risk of loss and delay is clearly needed.

For those leads of a DUT that require power, it is conventional in the art that a power connection be made to each such lead, and, during testing each of these leads is typically hot. Still, during testing, depending on the test vectors provided, the power draw on each such lead varies. At various times a relatively sudden demand for increased power may be made on one lead or another, or on all power leads at the same time.

When a demand for power is relatively sudden, due to multiple junctures and often necessarily small cross-section of conductive paths for power from a power supply to final connection to leads of a DUT, it has become a practice to provide decoupling capacitors near each power lead connection, with one end of the capacitor connected as close as is practical to the power lead, and the other connected to ground. These decoupling capacitors are typically and conventionally mounted between plated through holes and a ground plane on the backside of a load board; that is, the side opposite the side where a receptacle and a test socket are mounted.

To provide the best possible decoupling for power leads, closer coupling of capacitors to power leads is needed.

SUMMARY OF THE INVENTION

In a preferred embodiment of the present invention a method is provided for customizing a printed circuit board (PCB), comprising steps of (a) registering a template to the PCB, the template having an opening in registration defining a volume on the PCB where a conductive trace or jumper is desired; (b) placing a semi-liquid conductive polymer in the opening; (c) removing the template, leaving a conductive polymer trace or jumper on the PCB; and (d) curing the conductive polymer. The method is particularly applicable to PCBs used as load boards for IC testing apparatus.

In another aspect of the invention a Smart Receptacle is provided for connecting a test socket to a load board in an IC test apparatus. The Smart Receptacle has board engagement pins extending from the Smart Receptacle for connecting to holes in the load board, socket apertures in the Smart Receptacle connected to the board engagement pins, a ground plane connected by one or more ground pins to one or more ground-connected holes in the load board, and a decoupling capacitor mounted through the Smart Receptacle. One end of the decoupling capacitor is jumpered to one of the socket apertures, and the opposite end of the decoupling capacitor is jumpered to the ground plane.

In a preferred embodiment a Smart Receptacle according to the invention has jumpers for connecting decoupling capacitors made by registering a template to the Smart Receptacle, the template having openings in registration defining a volume on the load board where jumpers are required, placing a semi-liquid conductive polymer in the openings, removing the template, leaving a conductive polymer trace or jumper on the load board, and curing the conductive polymer. Smart receptacles are also provided having a power plane connected by one or more power pins to one or more power-connected holes in the load board, and jumpers are made from the power plane to individual ones of the decoupling capacitors and the socket apertures.

The method of making traces and jumpers by thick-film application of conductive polymer material provides a way to customize as well as to repair printed circuit boards. The application to load boards for testing apparatus reduces both cost and delay time for users to customize apparatus for particular DUTs, and further significantly improves operation of such systems by moving decoupling capacitors, ground, and sense lines closer to DUTs than has before been possible.

BRIEF DESCRIPTION OF THE DRAWINGS

FIG. 3 is an enlarged view of the area in dotted circle labeled "Detail A" in FIG. 2C, showing jumpers of conductive polymer material made by a method according to an embodiment of the present invention.

DESCRIPTION OF THE PREFERRED EMBODIMENTS

Figure 1A:
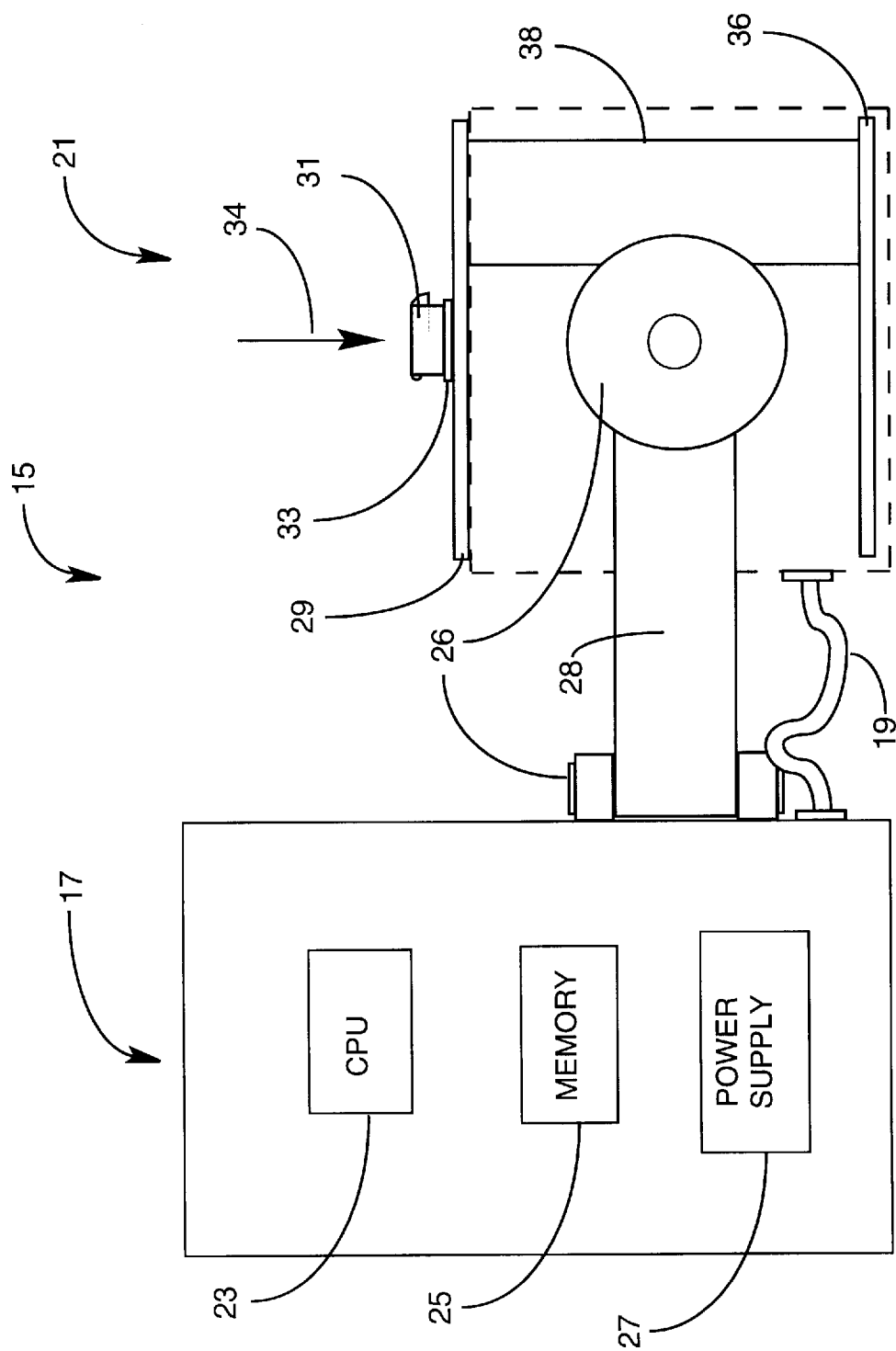
FIG. 1A, labeled prior art, is a representative illustration of a conventional IC test system 15 as known in the art.

FIG. 1A is a mostly block diagram of an IC test system 15 as known in the art. The system includes a computerized tester 17 connected by a cable bundle 19 to a test head 21. In actual systems there may be several cable bundles for the large number of conductors required from a tester to a test head.

Tester 17 generally comprises a computer processing unit (CPU) 23 for managing functions, a memory 25 for storing variable information and control routines, and power supplies 27 for supplying electrical power at appropriate voltage and current capacity to elements of the computerized tester, and also to test head 21. An interchangeable load board 29 is coupled to various conductors in cable bundle 19 from computerized tester 17 through mother board 36 and pin electronics boards 38 in test head 21. Load board 29, which is typically a multi-level board because of the large number of signals carried to a DUT for testing, serves as an interface to a socket 31 wherein a DUT is engaged for test. In conventional art, test head 21 is typically mounted on gimbals 26 and connected to computerized tester by bracket 28, or to a test stand, so test head 21 can be manipulated to allow test head 21 to mate with automated DUT loaders to facilitate IC testing.

There are various ways in the art that sockets are mounted to load boards in the type of test equipment described with reference to FIG. 1A. In some instances a socket may be mounted to the load board DUT test site, described in more detail below, by means of an intermediary receptacle 33, which is soldered to be semi-permanently mounted to the load board DUT test site, and has pins enabling sockets to be plugged into the receptacle and interchanged as necessary. In other instances, sockets are soldered directly to load board DUT test site.

Figure 1B:
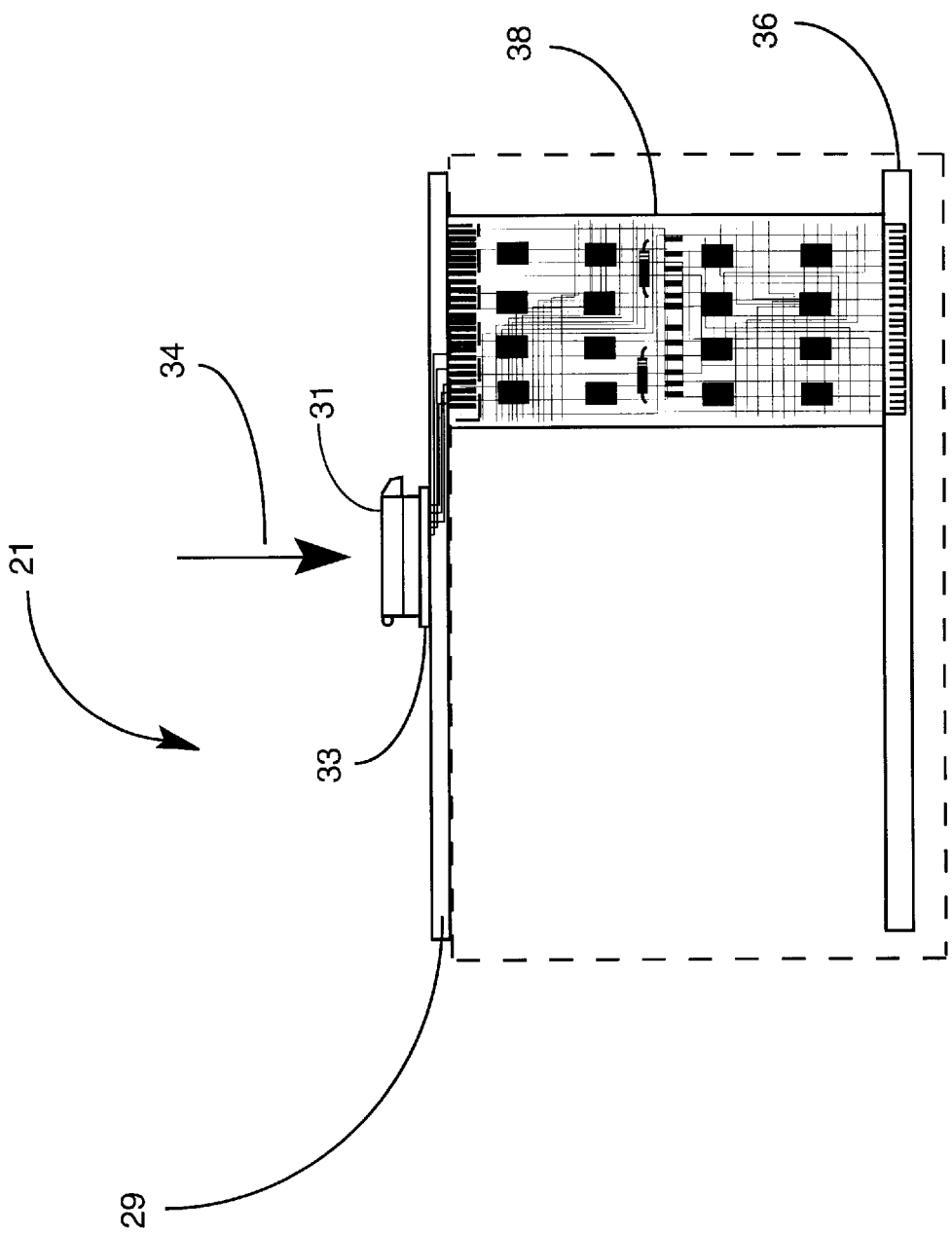
FIG. 1B, labeled prior art, is an illustration of a test head showing further detail.

FIG. 1B is a mostly block diagram showing more detail of test head 21, including a test head motherboard 36, which allows connection of test vectors to pin electronics cards 38. The pin electronics cards condition and route test vectors to load board 29, which is a multi-layered module board connecting test vectors, power supply voltages and ground connections to DUT socket 31 through intermediary receptacle 33. Only one pin electronics board 38 is shown here for simplicity of illustration, but there are typically several such pin electronics boards configured similarly, to perform a variety of tasks in conditioning test signals and the like. Only one test head is shown, but several test heads may be connected to a computerized tester 17, depending on testing requirements.

Intermediary receptacle 33 is shown here as one way to connect DUT test socket 31 to a test area on load board 29. Other methods may include soldering DUT socket 31 directly to a DUT test site, eliminating the need for intermediary receptacle 33 but making DUT socket 31 replacement on a given load board 29 impractical and costly.

Figure 2A:
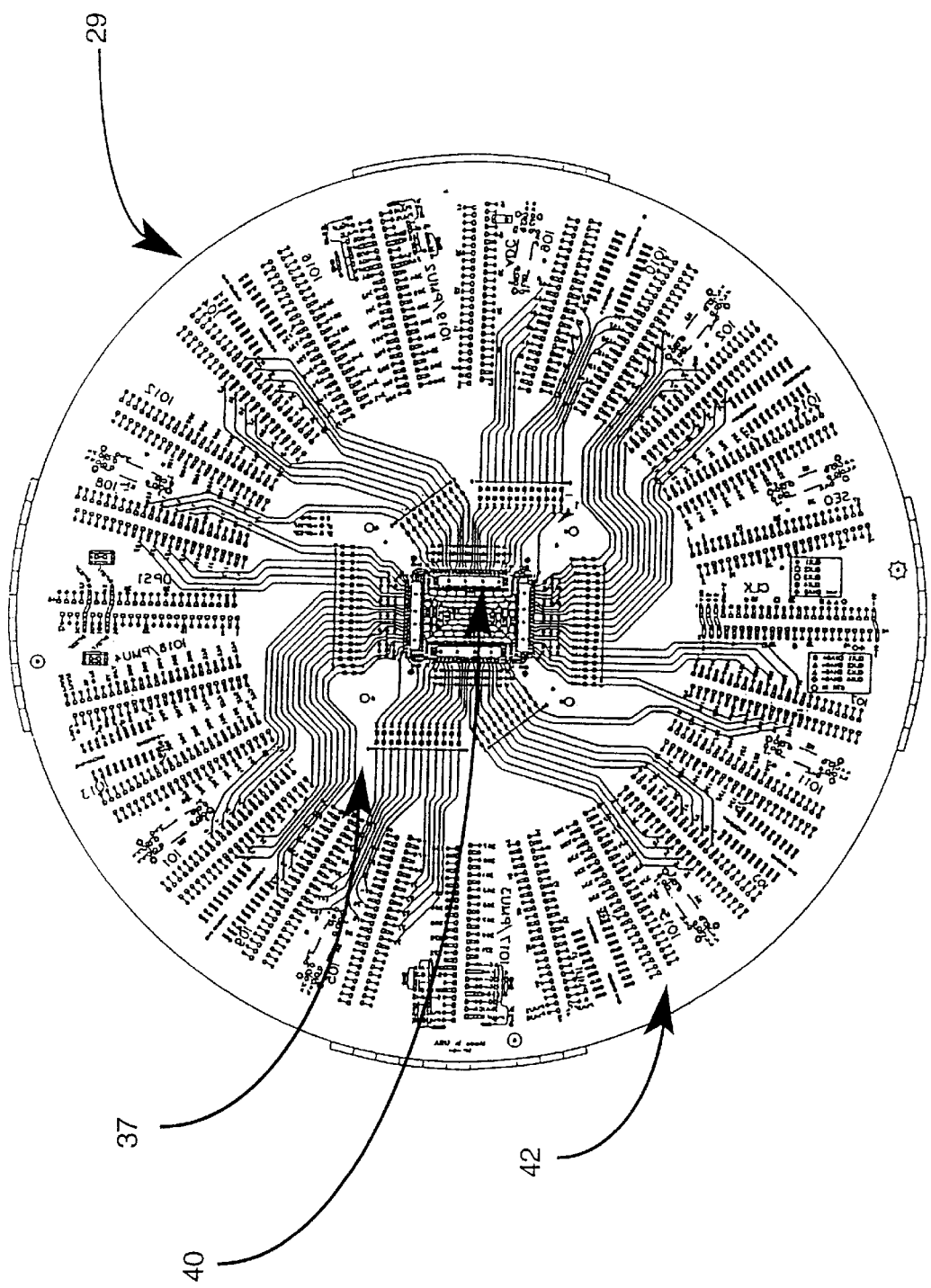
FIG. 2A, labeled prior art, is a plan view of a load board.

FIG. 2A is a plan view of load board 29, showing the opposite side, or underside, of the load board from the vantage point of arrow 34 in FIG. 1A and FIG. 1B. On this side of load board 29 there are typically contact points 42, to which pogo pins, or other means of connection well known in the art, interface with pin electronics boards 38 to establish power, ground, and vector signal connections to the rest of a test system 15 apparatus.

In center area 37 of board 29 there is a DUT test site 40, where through-holes are provided for engaging pins of either an intermediary receptacle or a test socket. As is well known to those with skill in the art, not all load boards are round, not all interface between a load board and a test head couple with pogo pins, and there are numerous alternatives to the typical and conventional apparatus and architecture shown here.

Figure 2B:
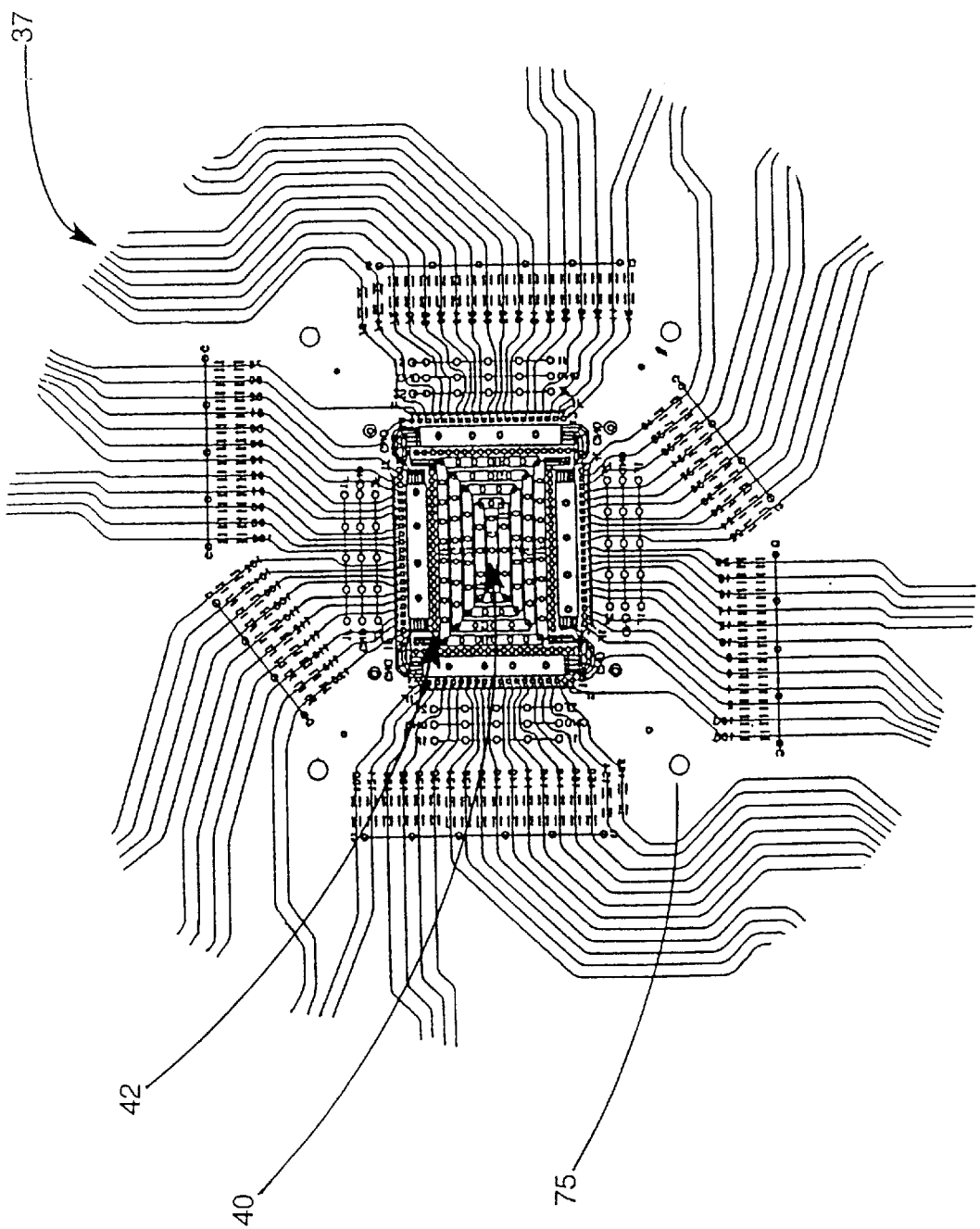
FIG. 2B, labeled prior art, is an enlarged plan view of the load board of FIG. 2A.

FIG. 2B is an enlarged plan view of a generally center area 37 of load board 29, which includes DUT test site 40. In this particular board fixture mounting holes 75 are provided as precision drilled holes which may be used for various purposes. In FIG. 2B, parallel rows 42 of plated through holes are shown arranged in a rectangular pattern near the center of the board. It is generally to these plated through holes that mounting pins of either a socket or a receptacle are engaged to the topside of load board 29.

The very large number of signal lines and other lines that must be brought to a DUT dictate the complexity shown, and it must also be remembered that, in many cases these are multi-level boards, wherein many signal lines, or power and or ground planes, are provided in the interior levels of the board. Six level boards, for example, are common in the art, and it is common to provide power and ground planes so a sufficient mass or cross-sectional area of conductor may be provided, considering the long distance from the power supplies in computerized tester 17 (FIG. 1A).

In the case of power and ground requirements, wherein the power and ground conductors typically originate in computerized tester 17, pass through test head 21 and through buried signal, voltage, and ground conductors and planes in load board 29, contact is brought to the surface of the board, as is well known in the art, by use of plated through holes. Signal lines are typically, but not necessarily provided as traces on the outside layers of the load board. Termination on the load board for these signal lines is also typically at plated through holes.

Figure 2C:
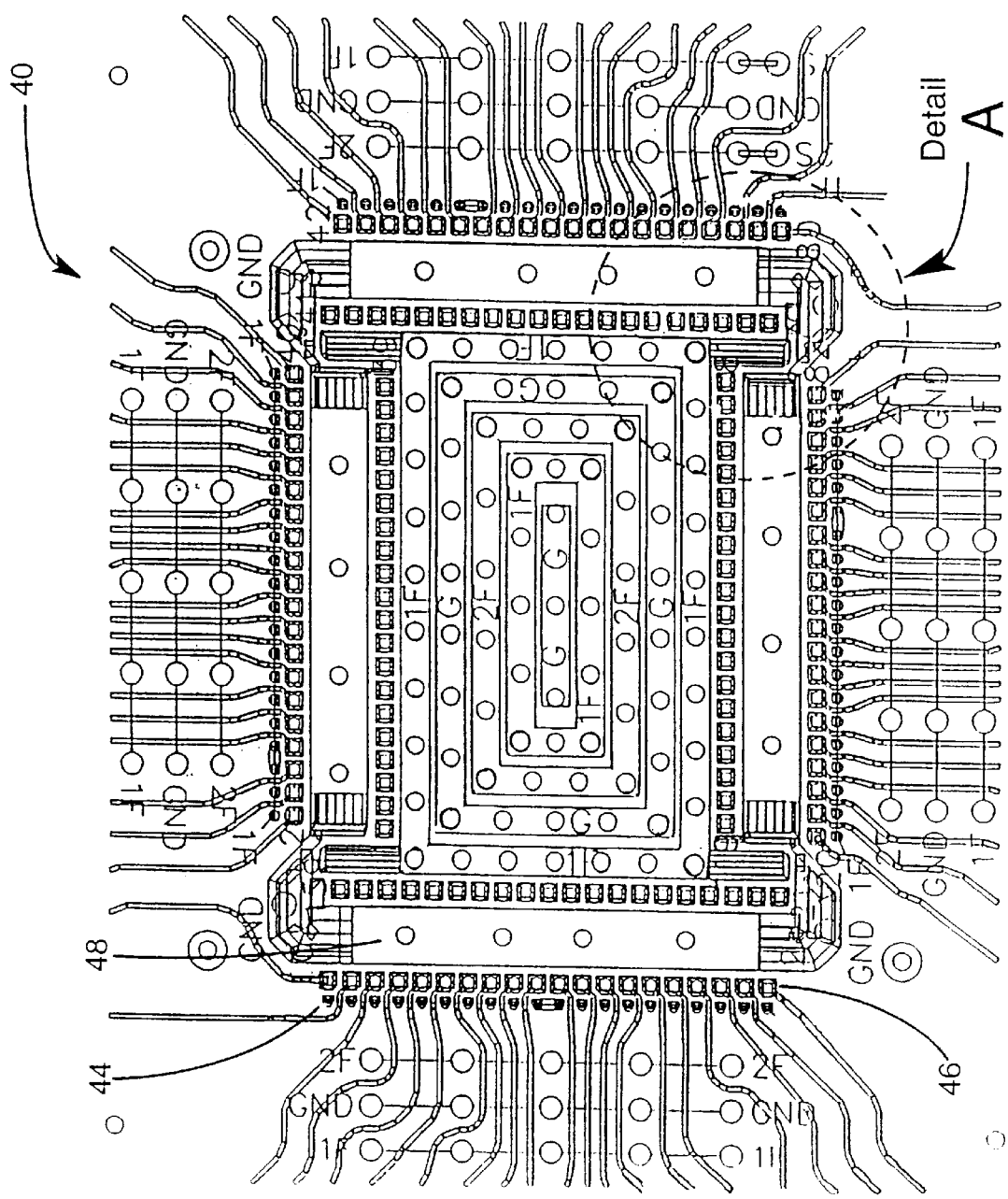
FIG. 2C, labeled prior art, is a further enlarged view of the load board of FIG. 2A and 2B.

FIG. 2C is a further enlarged plan view of test area 40 of load board 29, showing detail of DUT test site 40 where power supply and ground jumpers, not shown, are conventionally soldered to customize load board 29 to a unique DUT. Power supply voltages are typically connected from a test system 15 to plated through holes and solder pads 44 in the same positions throughout a family of load boards 29, and are customized to different unique DUTs by installing jumpers, not shown, from through-holes 44 to the proper DUT pinholes and solder pads 46.

Ground connection is typically made to plated through holes and solder pads 48 at the same positions throughout a family of load boards 29, and are customized to unique DUTs by soldering jumpers, not shown, from a ground position on plated through-holes and solder pads 48 to the proper DUT pinholes and solder pads 46.

There are problems, as described above, with manually soldering jumpers between DUT socket plated through-holes and solder pads and power supply and ground pinholes and solder pads. For example, jumpers and solder pads in a conventional apparatus are typically very small and closely spaced. There are a number of steps involved with each jumper connection in a conventional process. The conventional process is time consuming, tedious, and has a reasonable potential for bad solder joints that may need to be reworked, which increases the risk of damage to plated through holes and solder pads.

FIG. 3 is an enlarged illustration of the area in dotted outline labeled Detail A in FIG. 2C, which shows jumpers formed of a conductive polymer material, applied in a process according to a preferred embodiment of the present invention. There are a number of suitable conductive polymer materials, such as Silver-Conductive No. 402 Resin, made by Adhesive Systems of Germantown Wis., which, after being applied, have conductive properties similar to conductive metal jumpers as typically made in current art.

In making such jumpers, practicing the present invention involves use of a template, with openings for placing conductive polymer material at exactly the right position to make a jumper, either for power or for ground. A template in practicing the invention is configured for a unique DUT and more fully described below, and is secured firmly to cover DUT test site 40. A conductive polymer is applied over all template openings for conductive paths in a method more fully described below, and the template is shortly removed. Load board 29 is then processed, such as by heating, to cure the conductive polymer.

FIG. 3 shows conductive polymer jumpers 45A from power-connected plated through-holes 47 and 49 to the proper DUT socket plated through-holes with solder pads 50 and 52. Conductive polymer jumpers 45B connect from ground plane 48 to DUT plated through holes and solder pads 54 and 58. The method of applying conductive epoxy for jumpers to load board 29 is accomplished more easily and less expensively than the conventional method of making soldered jumpers.

Figure 4A:
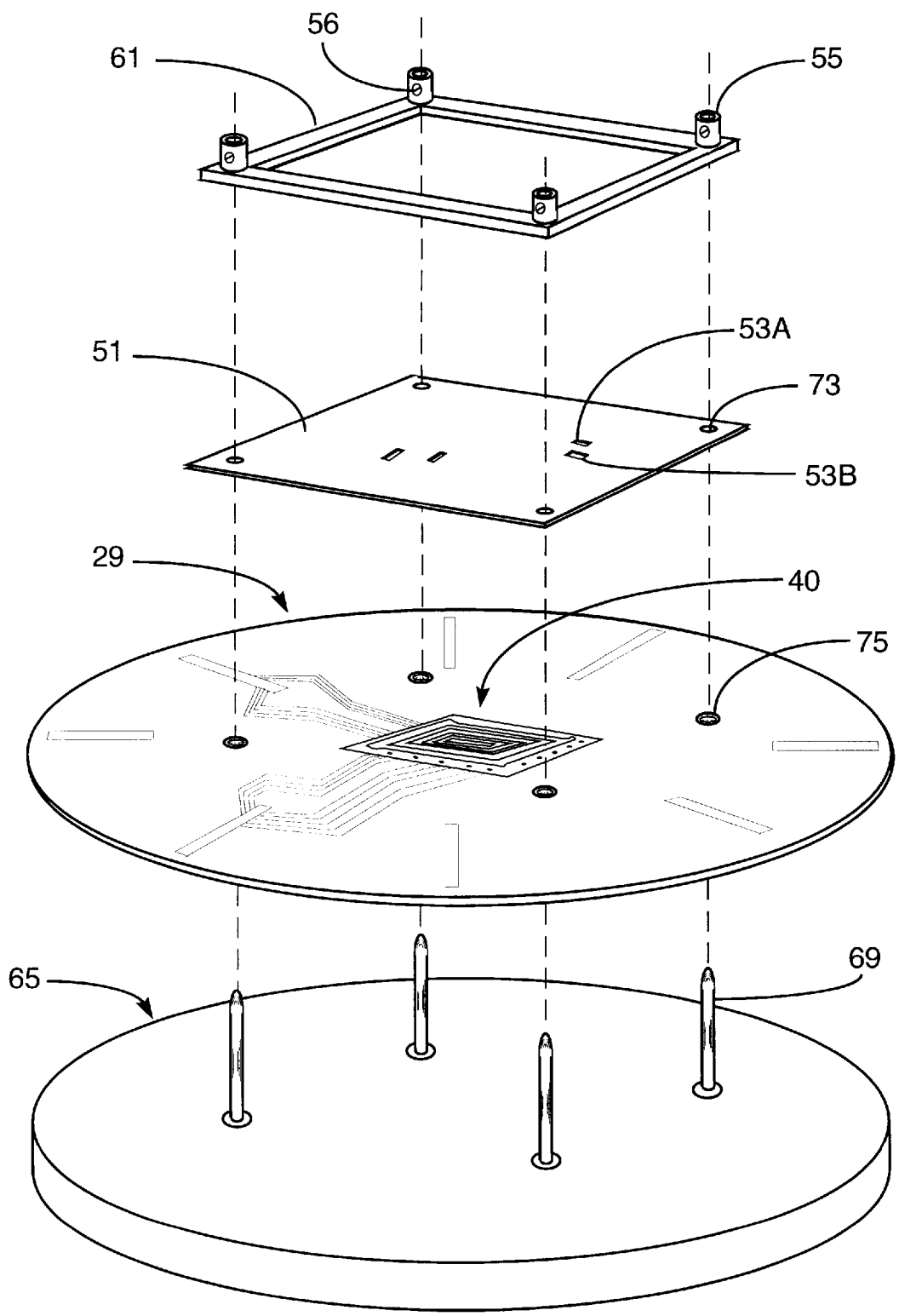
FIG. 4A is an exploded isometric view of a thick-film apparatus according to an embodiment of the present invention for applying conductive polymer jumpers to configure test system power supply and ground connections on a load board.

FIG. 4A is an exploded isometric view of an apparatus according to an embodiment of the present invention for applying conductive polymer jumpers to configure power and ground connections on a load board to match the requirements of a unique DUT socket. A template 51 is provided with openings 53A and 53B positioned precisely to make jumpers on load board 29. In addition to openings for making jumpers, template 51 also has alignment holes 73 for aligning the template to a load board, and openings 53A and 53B are positioned accurately relative to alignment holes 73.

Template 51 may be made of a variety of materials with consideration given to an ability to provide openings such as openings 53A and 53B with substantial accuracy relative to alignment holes, and to dimensional stability. Several plastic materials are suitable, such as polyethylene and others, and metals such as shim stock may also be used in some cases. The alignment holes and precision openings for making jumpers may be made in the template in any of several ways, such as by punching, laser machining, discharge machining, and the like, determined in part by the kind of material used for the template.

A frame 61 fits over and contacts all edges of template 51 to provide a firm contact between template 51 and DUT test site 40 so that openings 53A and 53B define precise volumes to define conductive jumpers. Load board 29, template 51, and frame 61 assemble on pins 69 engaged accurately in a fixture 65 to accurately and firmly position the elements to insure that conductive polymer jumpers are applied precisely.

Holding pins 69 pass through load board mounting holes 75, template alignment holes 73, and bushings 55, and the assembly is secured by set screws 56 in bushings 55.

Figure 4B:
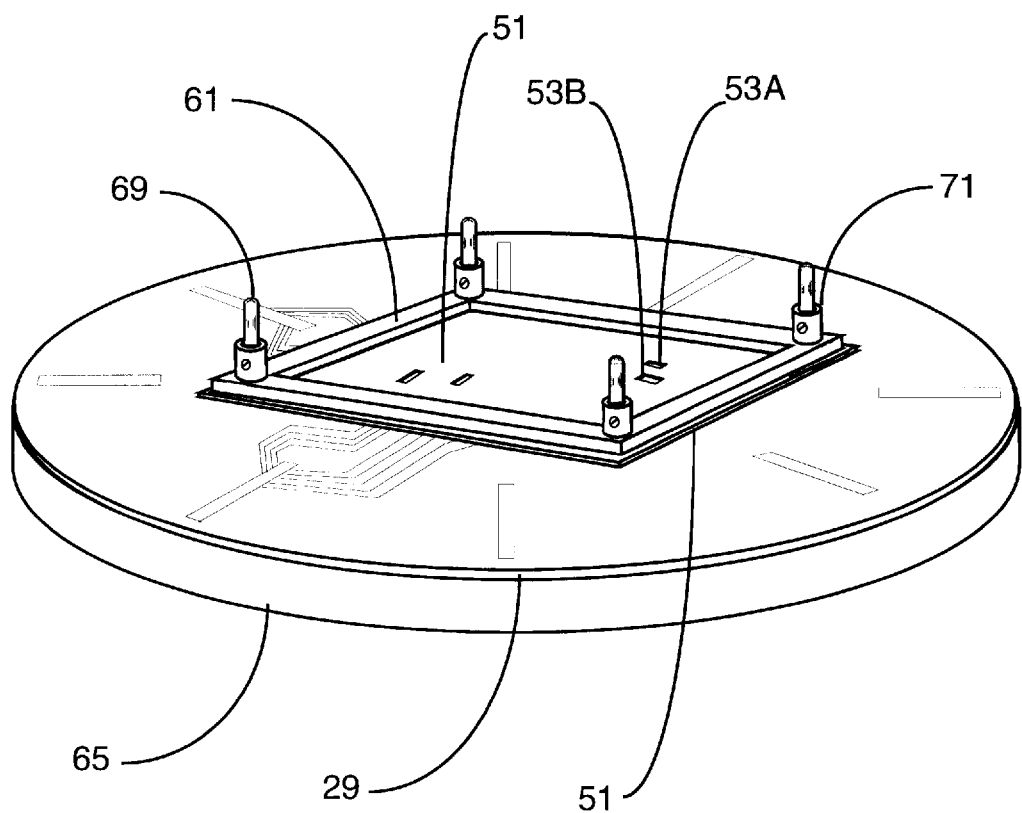
FIG. 4B is an isometric view of the exploded apparatus of FIG. 4A, assembled for practicing a method according to an embodiment of the present invention.

FIG. 4B is an isometric view of the apparatus of FIG. 4A fully assembled for making conductive polymer jumpers. Load board 29 is placed on load board fixture 65. Template 51 is placed on load board 29 covering test site 40. Holding frame 61 is placed over template 51. All the above elements are secured firmly by holding pins 69, bushings 55, and set screw 56. A conductive polymer is applied over, and worked into the template openings 53A and 53B in any convenient manner, such as by a sqeegie, to assure complete filling of openings and forming of the polymer jumpers. After applying conductive polymer jumpers, template 51 is removed from load board 29 and the load board is heated to facilitate curing of the polymer material.

In FIG. 3, jumpers are made on one side of the load board, in this case the underside of the board from the side where a receptacle or test socket is mounted. In some embodiments, however, jumpers may be made on either side or both sides of the board. For example, the ground jumpers for the board shown might be made on the underside, where a broad ground plane 48 is shown, and the power jumpers may be made on the topside of the board.

In the case of jumpers made on both sides of the board, the process according to the invention will be repeated on the opposite side of the board with a different template. Further, the board shown is but one example of many possible board designs. The locations of power through-holes 44 adjacent each of the pinholes 46 is convenient in the example described, but is not necessarily the case in all instances. A power plane on the topside of a board may, for example, be implemented similar to the ground plane shown on the bottom side of the board, and jumpers could be made from pinholes to the power plane on the topside.

In still another aspect, points to be connected on a board may be relatively remote, compared to the example described above. In some cases, then, openings in a template for practicing the present invention may be fashioned to provide conductive traces of some considerable length relative to the short jumpers shown. In the case of relatively remote points to be connected, the traces provided by filling opening in a template with conductive material while the template is maintained in an appropriate position, may be relatively complex, having one or more turns, rather than being simple straight lines. Such geometry in some embodiments may well be needed to avoid other features on a board to be processed.

Figure 4C:
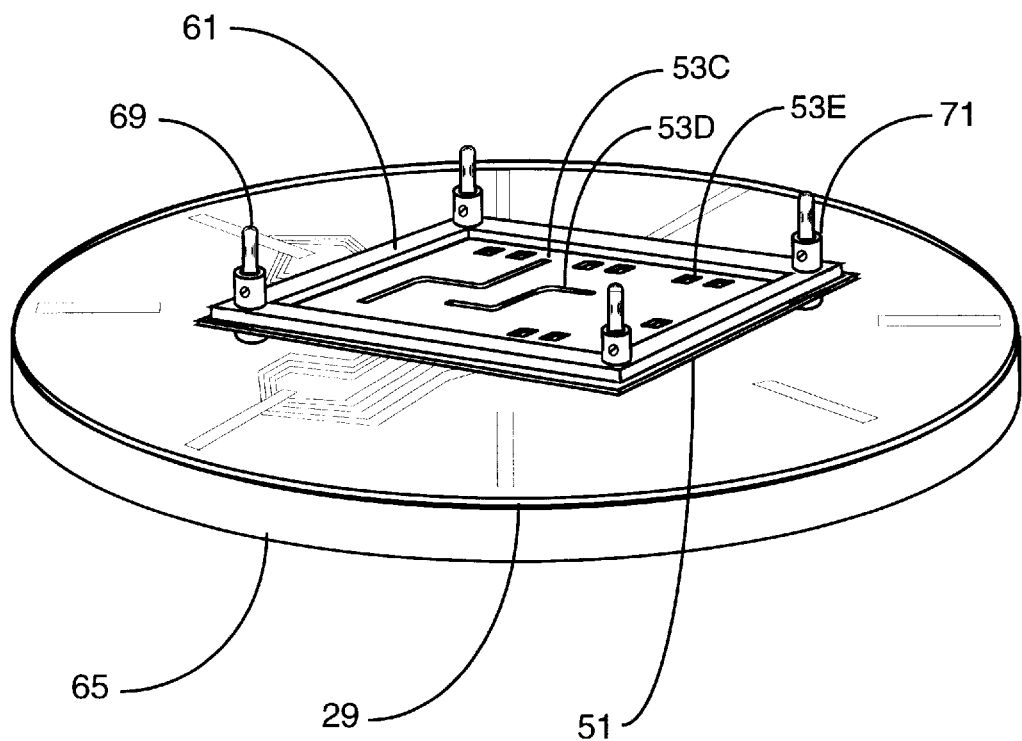
FIG. 4C is an isometric view of an assembled thick-film apparatus according to another embodiment of the present invention.

FIG. 4C is an isometric view of an embodiment of the apparatus shown in FIGS. 4A and 4B having openings in a template to provide traces on a printed circuit board. This apparatus is the same as the apparatus previously described, except openings 53C and 53D are elongated and shaped to provide conductive traces on board 29 rather than simply short jumpers as shown in FIGS. 4A and 4B. In FIG. 4C, opening 53E represents jumper openings similar to openings 53A and 53B in FIGS. 4A and 4B. Such openings as these can be extended and designed to provide traces and jumpers of virtually any description on a load board, or indeed on any sort of printed circuit board.

It will be apparent to those with skill in the art that there are a variety of alterations that might be made in details of embodiments of the apparatus described above without departing from the spirit and scope of the invention. For example, there are many different types of conductive polymer that can be used instead of Silver-Conductive No. 402 Resin, as long as electrical conductive, adhesive, and other relevant physical characteristics make the material suitable for applying to a load board through a template. There are similarly many alterations in the apparatus that might be made within the spirit and scope of the invention. For example, there are equivalent ways the board and the template might be registered and secured to accomplish practicing the invention.

As an example of other securing methods, the template could be secured to the load board by such as tape over the edges of the template onto the load board, or a template with sticky-back material like "Post-it" memos might be used, which would make the template stick to the load board while applying a conductive polymer, and could then easily be peeled off after application. One might also use any of a number of latching devices with a holding frame, such as cam locks, wing nuts, or cotter keys.

A Smart Receptacle

The embodiments described above provide a quick and relatively inexpensive method for customizing a load board for IC test apparatus so power and ground connect to the appropriate leads of a DUT placed in a socket mounted on and connected to the load board. A customized load board according to the above descriptions and equivalents can be used with conventional receptacles and sockets in a test system.

In another aspect of the present invention, the inventor has provided a unique receptacle, termed by the inventor a Smart Receptacle, that allows decoupling capacitors to be coupled much closer to power leads of a DUT than has previously been possible. In some aspects of the invention this Smart Receptacle can be used with a load board customized according to a process of an embodiment of the present invention, and in other aspects the load board can be conventional, and full customization is accomplished by the receptacle instead of by forming finishing jumpers on the load board.

Figure 5:
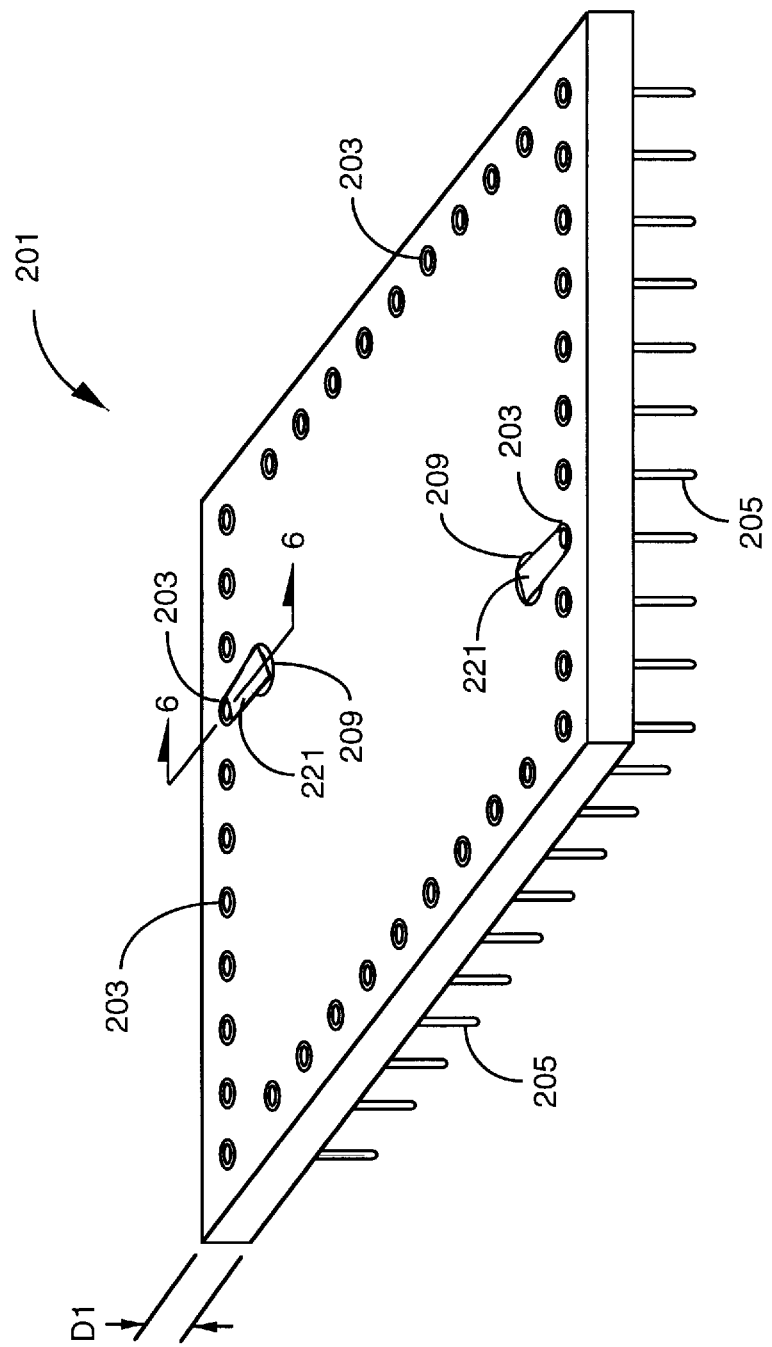
FIG. 5 is an isometric view of a Smart Receptacle according to an embodiment of the present invention.

FIG. 5 is an isometric view of a Smart Receptacle 201 according to one embodiment of the present invention. As is known in the art, a receptacle is typically provided to adapt a test socket to a load board in a manner that allows the test socket to be interchangeable. The plated through-holes in a load board are not generally suitable for simply engaging the pins of a test socket without soldering the test socket pins into the plated through holes. Direct connection of a test socket to a load board then, provides an assembly wherein the test socket is not easily removable to be interchangeable with other sockets.

Pins are provided on receptacles for engaging plated through holes in a load board, and soldering to the plated through holes. These pins generally relate on a one-to-one basis with leads of a socket, and may be in any one of several well-known patterns. Each pin connects to a socket aperture which extends through generally the thickness of the receptacle. Each of these socket apertures, as they are termed in this disclosure, is a female hollow pin configured to receive a male pin from a socket, and to make efficient electrical contact by friction.

In Smart Receptacle 201 of FIG. 5, each of pins 205 connects to a socket aperture 203 which extends through thickness D1 of Smart Receptacle 201. This much of the structure of the Smart Receptacle is conventional, and serves the same purpose as the equivalent structure of a conventional receptacle.

In the case of leads of a DUT that require power, as was described above in the Background section, due to multiple junctures and often necessarily small cross-section of conductive paths for power from a power supply to final connection to leads of a DUT, it has become a practice to provide load capacitors near the lead connection, with one end of the capacitor connected as close as is practical to a lead requiring power, and the other connected to ground. These load capacitors are typically and conventionally mounted between plated through holes and a ground plane on the backside of a load board; that is, the side opposite the side where a receptacle and a test socket are mounted.

In Smart Receptacle 201, extra holes 209, which are not plated through, are provided preferably adjacent to those pins requiring power, and a decoupling capacitor is placed in each hole 209. The diameter of holes 209 and the thickness D1 of the Smart Receptacle is made to accommodate the full length of the decoupling capacitors to be used. Available sizes of these capacitors is well known in the art. For example, one popular decoupling capacitor is about 0.060 inches in diameter and about 0.125 inches long. For this capacitor, a hole 209 would be provided somewhat greater in diameter than 0.060 inches, and the receptacle board would be made to a thickness D1 of about 0.125 inches.

In a preferred embodiment of the invention, the Smart Receptacle is made as a printed circuit board, for reasons that are made clear by disclosure below. Printed circuit board material and construction, however, is convenient, and not strictly required. There are other ways that Smart Receptacles according to the invention may be made.

Finally relative to FIG. 5, although it is not seen in FIG. 5, there is a ground plane (copper area) implemented on the underside of the Smart Receptacle. The purpose of the ground plane is primarily to provide grounding for decoupling capacitors mounted through the Smart Receptacle. Also, holes 209 can be provided in more than one way.

In one embodiment, a pattern of holes 209 capable of mounting a decoupling capacitor is provided such that one hole 209 is available near each socket aperture 203. Because of the generally larger diameter of holes 209 than socket apertures 203, there are, in this embodiment, fewer holes 209 than there are socket apertures 203. A hole 209, for example, may be provided adjacent to each second aperture 203. Such a hole 209 may then serve either the immediately adjacent aperture 203 or the aperture immediately to either side.

In an alternative embodiment, holes 209 are drilled or otherwise fabricated after it is determined which apertures 203 are to be tied to power. Then one hole 209 is made for each aperture 203 needing power connection.

Figure 6:
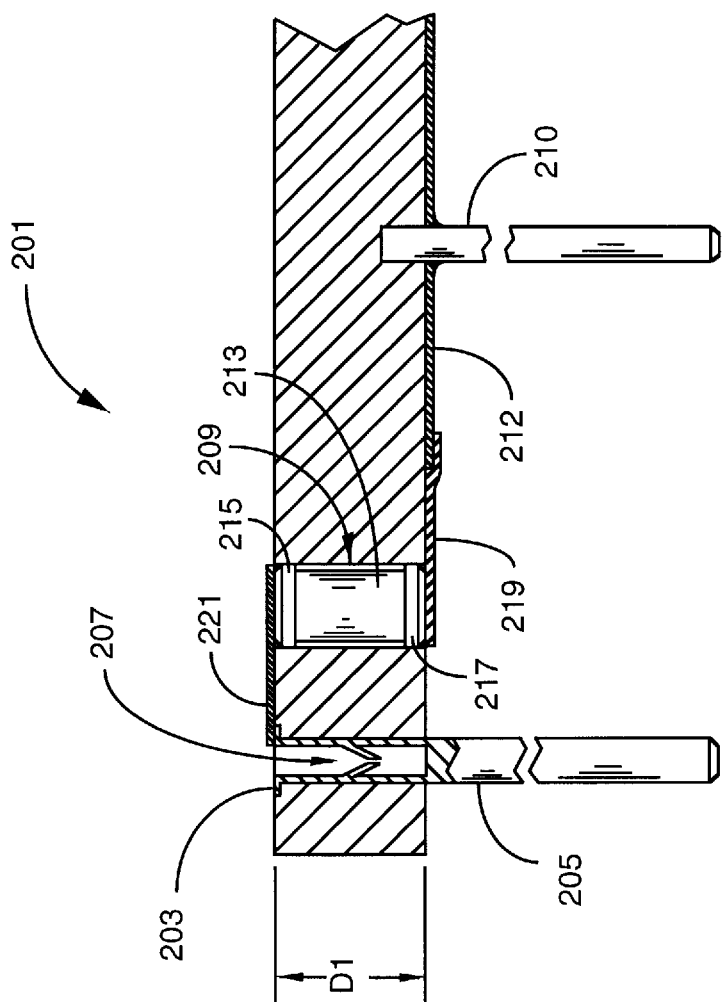
FIG. 6 is a partial cross section of the Smart Receptacle of FIG. 5 taken along section line 6—6 of FIG. 5.

FIG. 6 is a partial cross section of Smart Receptacle 201 taken along section line 6—6 to show the special nature of the socket apertures, pins, and location of decoupling capacitors in holes 209. Socket aperture 203 has a resilient conical structure 207 which assures that pins from a test socket may be engaged by friction alone while providing intimate electrical contact. This structure of pins 205 and socket apertures 203 is well-known in the art.

In the Smart Receptacle according to the embodiment of FIG. 6, extra pins such as pin 210, are provided to bring ground from the load board to a ground plane 212 on the underside of the Smart Receptacle. There are, for a Smart Receptacle according to embodiments of the invention, typically more than one such ground pin, so the ground plane provided is a hearty ground connection.

In FIG. 5, two socket apertures 203 are assumed, for purposes of illustrating this embodiment of the invention, to require power. A single through-hole 209 is shown near each of the socket apertures 203 requiring power, although there may be more holes 209, as described above. A decoupling capacitor 213, which has conductive bands 215 and 217 at the ends, is inserted in through-hole 209.

To connect decoupling capacitor 213 to socket aperture 203 and to ground plane 212, a jumper 219 is provided to ground plane 212 on the underside, and a jumper 221 is provided to the adjacent socket aperture 203 on the top side. The power connection of cap 213 is thus made at the top side of Smart Receptacle 201 rather than at the underside of the load board, closer to the power lead of a DUT by about 0.5 inches, which is a significant improvement over the prior art. The ground connection is made to a robust ground plane on the back of the Smart Receptacle.

The ground plane can be larger than shown, with the through-holes 209 passing through the ground plane. In this case the connection from the ground end of a decoupling capacitor to the plane can be made by soldering at the end of hole 209 to the ground plane, or by applying a thick-film end cap at that position. Also, rather than thick-film jumpers 221 from the upper end of a decoupling capacitor to apertures 203, a PCB trace might be provided from each aperture 203 to each adjacent hole 209. When a decoupling capacitor is inserted, it is needed only to solder at the upper end of the cap to the trace, or to apply a dot of thick-film conductive polymer according to the present invention.

In addition to ground jumpers for decoupling capacitors, those pins requiring ground connection may optionally be jumpered on the underside of Smart Receptacle 201 to ground plane 212 rather than being jumpered on load board 129 as previously described.

Jumpers 219 and 221 for Smart Receptacle 201 may be made in a number of ways, just as load boards are customized by jumpers in a number of ways, such as by hand soldering the connections or soldering wires between the connection points. In a preferred embodiment, however, an unfinished Smart Receptacle is placed on a holding fixture, a template is registered to the same fixture, and the jumpers are made by urging conductive polymer into openings in the template strategically placed to make the jumpers. The apparatus and procedure in this embodiment is very similar to that described above for customized load boards with reference to FIGS. 4A and 4B.

The Smart Receptacle in the embodiment shown in FIGS. 5 and 6 is preferably used with customized load boards of the type described above, wherein jumpers to power and ground are made by applying conductive epoxy with a template. Such a Smart Receptacle, however, may also be used independently, with load boards that are fully customized in the PCB manufacturing process, or customized by solder or wire jumpering on a more generic board.

Figure 7:
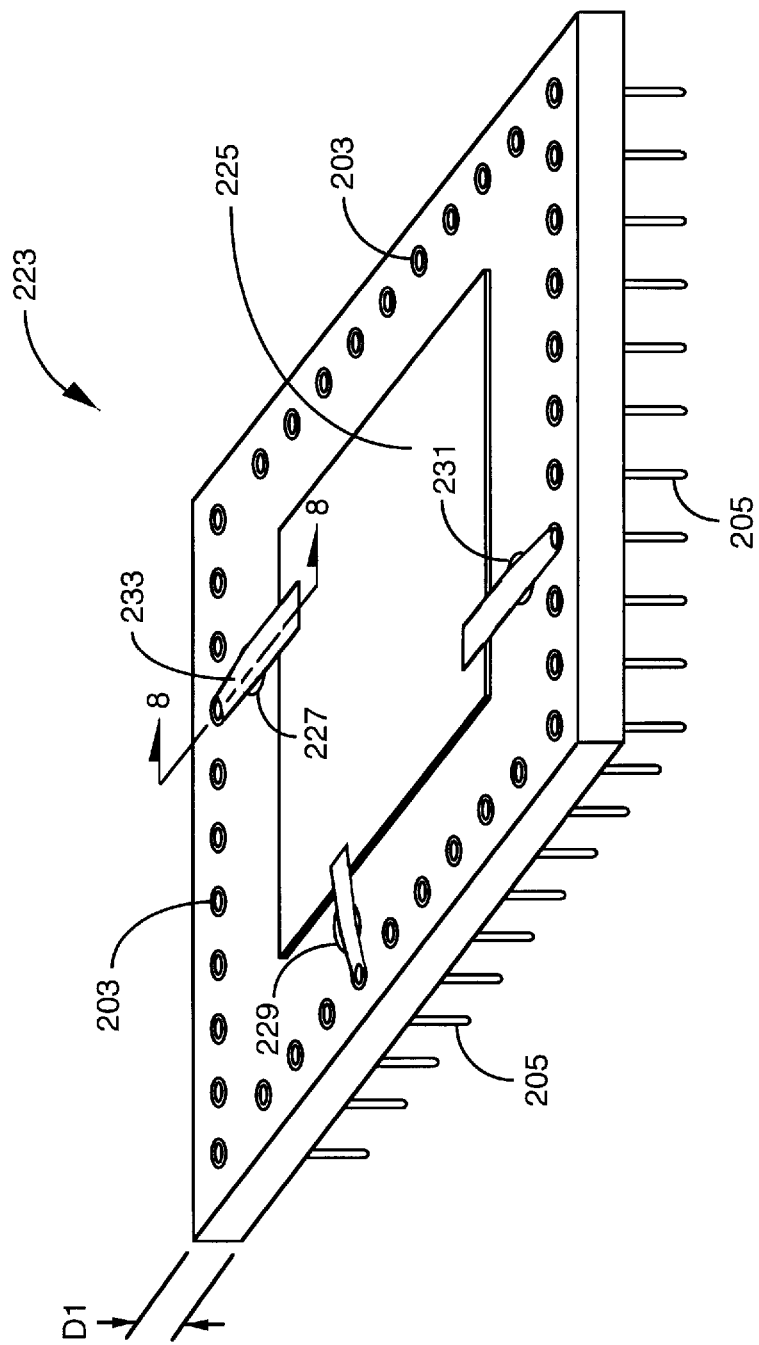
FIG. 7 is an isometric view of a Smart Receptacle according to another embodiment of the present invention.

In an alternative embodiment a Smart Receptacle 223 is shown in FIG. 7 having a power plane 225 on the top side of the Smart Receptacle 223, and connected to power via extra pins through the thickness of Smart Receptacle 223 (not shown in FIG. 7, which power pins connect to throughholes provided in the load board that are connected to the power plane of the load board. In this embodiment, for illustration, three leads are assumed to require power. Decoupling capacitor holes 227, 229, and 231 are provided adjacent to the socket apertures 203 for these power leads, between the socket apertures 203 and the power plane 225.

Figure 8:
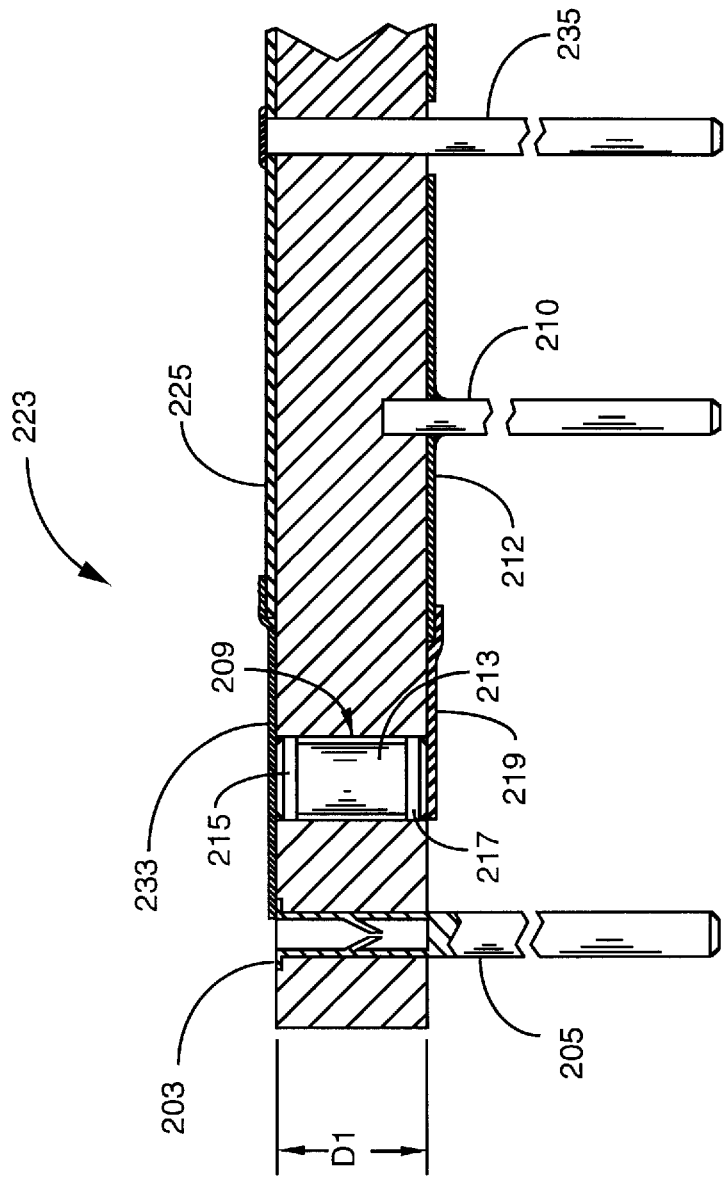
FIG. 8 is a partial section elevation view of the Smart Receptacle of FIG. 7 taken along section line 8—8 of FIG. 7.

FIG. 8 is a cross section of Smart Receptacle 223 of FIG. 7 taken along section line 8—8 of FIG. 7. Elements and dimensions common to the structure of FIG. 6 are given common element numbers for convenience. For example, pins 205 connect to socket apertures 203 as in Smart Receptacle 201 (FIG. 6). Also, jumpers 219, preferably made by the thick-film template technique of the present invention, connect from ground plane 212 to one end of decoupling capacitors 213 in holes such as hole 209 shown.

Power plane 225 connects to power pins on load board 129 (not seen in FIG. 8) by pins 235 which pass through the thickness of Smart Receptacle 223 at positions where ground plane 212 has an opening. There may be several pin connections for power plane 225, to assure a robust power plane.

In Smart Receptacle 223 jumpers 233 are made from apertures 203 across one end of decoupling capacitors 213 and further to power plane 225. These jumpers may be made by conventional processes, or they may be made by the thick-film technique of the present invention with a template. Additionally, ground-only jumpers for apertures 203 requiring ground connection are made by jumpers on the underside of Smart Receptacle 223 between pins 205 and ground plane 212. These jumpers may also be made conventionally, or preferably by the thick-film technique of the present invention.

A smart receptacle according to various embodiments of the present invention, then, may provide no customizing function, and the load board is customized completely, or may provide a part of or all of the customization function. By providing ground-only jumpers, a Smart Receptacle provides a portion of the customizing function, and by having a power plane and a ground plane, and jumpering to appropriate pins (apertures), all of the needed customization may be done on the Smart Receptacle. In this case, a generic load board may be provided for many types of ICs having common pin geometry.

As was described above for Smart Receptacle 201, Smart Receptacle 223 may also be designed such that jumpers required may be relatively long and complex, like traces on a printed circuit board. Such traces are achievable by the thick-film technique of the present invention.

In test systems like those described above, both conventionally and according to preferred embodiments of the present invention, there are lines other than power, ground, and signals to a socket. These are Sense lines, which are provided to monitor voltages at power and ground points near the leads (if possible) of a DUT. In a further embodiment of the present invention, sense lines for power and ground are brought to the Smart Receptacle and connected to the power and ground planes of the receptacle, thus bringing sensing closer to the DUT than is possible in current art.

It will be apparent to those with skill in the art that there are many alterations that may be made in the embodiments of the invention described herein without departing from the spirit and scope of the invention. For example, there are many alternatives for design of load boards to provide a board to which jumpering may be applied according to the spirit and scope of the present invention. Some designs provide a more convenient starting point than do others.

As another example, there are many formulations of conductive materials that might be used, and there are many variations in geometry of jumpers that might be made. There are similarly many variations that might be made in templates for the unique thick-film process of the invention, and there are many variations in the apparatus that might be used for registering templates to load boards, Smart Receptacles, and to other kinds of printed circuit boards within the spirit and scope of the invention. In point of fact, the provision of traces and jumpers on boards by registering a template and applying thick-film conductive polymer material is unique in the art.

There are, as will be apparent to those with skill in the art, many other variations that might be made in apparatus and methods described without departing from the spirit and scope of the invention.

What is claimed is:

1. A Smart Receptacle having an upper surface, a lower surface, and a thickness, the Smart Receptacle adapted for connecting a test socket to a load board in an IC test apparatus, comprising:

electrically-conductive board engagement pins extending from the lower surface of the Smart Receptacle for connecting to holes in the load board;

a first array of socket apertures in the upper surface of the Smart Receptacle, each socket aperture collinear with and connected to one of the board engagement pins;

a second array of holes through the thickness of the Smart Receptacle and opening to both the upper and lower surfaces of the Smart Receptacle, the second array of holes characterized in that the opening of each hole in the upper surface in the second array is adjacent to a socket in the first array at the upper surface; and a ground plane defined by a planar electrical conductor on the lower surface, the planar conductor positioned such that a portion of the planar conductor lies laterally adjacent to each hole opening in the second array in the lower surface.

2. The Smart Receptacle of claim 1 wherein the holes in the second array are round and are characterized by having a length and diameter substantially the same a commercially-available round IC capacitor.

3. The Smart Receptacle of claim 2 wherein the thickness is substantially 0.125 inches and the diameter of the holes in the second array is substantially 0.060 inches.

4. The Smart Receptacle of claim 1 further comprising a power plane formed by a planar electrical conductor on the upper surface, the power plane connected via one or more pins through the thickness of the Smart Receptacle and extending from the lower surface.

* * * * *